(12) United States Patent
Kim et al.

(10) Patent No.: US 11,662,504 B2
(45) Date of Patent: May 30, 2023

(54) ELECTRICALLY TUNABLE METASURFACES INCORPORATING A PHASE CHANGE MATERIAL

(71) Applicant: California Institute of Technology, Pasadena, CA (US)

(72) Inventors: Yonghwi Kim, Pasadena, CA (US); Pin Chieh Wu, Pasadena, CA (US); Ruzan Sokhoyan, Pasadena, CA (US); Kelly W Mauser, Pasadena, CA (US); Rebecca D Glaudell, Pasadena, CA (US); Ghazaleh Kafaie Shirmanesh, Pasadena, CA (US); Harry A Atwater, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 259 days.

(21) Appl. No.: 16/740,322

(22) Filed: Jan. 10, 2020

(65) Prior Publication Data

US 2020/0227632 A1 Jul. 16, 2020

Related U.S. Application Data

(60) Provisional application No. 62/792,010, filed on Jan. 14, 2019.

(51) Int. Cl.
*G02B 1/00* (2006.01)
*G02F 1/01* (2006.01)
*G02B 26/06* (2006.01)

(52) U.S. Cl.
CPC .............. *G02B 1/002* (2013.01); *G02B 26/06* (2013.01); *G02F 1/0147* (2013.01);
(Continued)

(58) Field of Classification Search
CPC ....... G02B 1/002; G02B 26/06; G02F 1/0147; G02F 2202/30; H01L 45/06; H01L 45/1286; H01L 45/144; H01L 45/146
(Continued)

(56) References Cited

U.S. PATENT DOCUMENTS 10,802,301 B2  10/2020 Wu et al.
2016/0223723 A1  8/2016 Han et al.
(Continued)

FOREIGN PATENT DOCUMENTS

KR   1020180099326 A   9/2018
WO   2013/068516 A1    5/2013

OTHER PUBLICATIONS

Arbabi, A., et al., "Dielectric metasurfaces for complete control of phase and polarization with subwavelength spatial resolution and high transmission," *Nat. Nanotechnol.* 10, 937-943,2015. 8 Pages.
(Continued)

*Primary Examiner* — William Choi
(74) *Attorney, Agent, or Firm* — Steinfl + Bruno, LLP

(57) ABSTRACT

Electrically tunable metasurfaces including an array of subwavelength metasurface unit elements are presented. The unit elements include a stacked metal-insulator-metal structure within which an active phase change layer is included. A purely insulator, metal, or coexisting metal-insulator phase of the active layer can be electrically controlled to tune an amplitude and phase response of the metasurfaces. In combination with the subwavelengths dimensions of the unit elements, the phase and amplitude response can be controlled in a range from optical wavelengths to millimeter wavelength of incident light. Electrical control of the unit elements can be provided via resistive heating produced by flow of current though a top metal layer of the unit elements. Alternatively, electrical control of the unit elements can be
(Continued)

provided via electrical field effect produced by applying a voltage differential between the top and bottom metal layers of the unit elements.

9 Claims, 7 Drawing Sheets

(52) U.S. Cl.
CPC ........ G02F 2202/30 (2013.01); H10N 70/231 (2023.02); H10N 70/8613 (2023.02); H10N 70/8828 (2023.02); H10N 70/8833 (2023.02)

(58) Field of Classification Search
USPC ........................................................ 359/279
See application file for complete search history.

(56) References Cited

U.S. PATENT DOCUMENTS

| | | |
|---|---|---|
| 2017/0023803 A1 | 1/2017 | Han et al. |
| 2017/0276848 A1 | 9/2017 | Sinclair et al. |
| 2018/0046056 A1 | 2/2018 | Na et al. |
| 2018/0321518 A1 | 11/2018 | Atwater |
| 2019/0079321 A1* | 3/2019 | Wu ...................... G02F 1/0555 |

OTHER PUBLICATIONS

Black, L.-J., et al., "Optimal Polarization Conversion in Coupled Dimer Plasmonic Nanoantennas for Metasurfaces" ACS Nano, 8 (6), 6390-6399.May 7, 2014. 10 Pages.
Bohn, J., et al., "Active Tuning of Spontaneous Emission by Mie-Resonant Dielectric Metasurfaces," Nano Lett., 18 (6), 3461-3465. Apr. 30, 2018. 5 Pages.
Carr, G. L., et al., "Far-Infrared Properties of Inhomogeneous Materials," In Infrared and Millimeter Waves;Academic Press, vol. 13, pp. 171-263.1985. 163 Pages.
Chen, W. T., et al., "High-Efficiency Broadband Meta-Hologram with Polarization-Controlled Dual Images," Nano Lett. 2014, 14 (1), 225-230.Dec. 13, 2013. 6 Pages.
Chen, Y., et al., "Engineering the Phase Front of Light with Phase-Change Material Based Planar lenses," Sci. Rep., 5, 8660. 2015. 7 Pages.
Choi, H. S., et al., "Mid-infrared properties of a VO2 film near the metal-insulator transition," Phys. Rev. B: Condens. Matter Mater. Phys., 54 (7), 4621-4628. Aug. 15, 1996. 9 Pages.
Dabidian, N., et al., "Electrical Switching of Infrared Light Using Graphene Integration with Plasmonic Fano Resonant Metasurfaces," ACS Photonics2015, 2 (2), 216-227.Dec. 22, 2014. 12 Pages.
De Galarreta, C. R., et al., "Nonvolatile Reconfigurable Phase-Change Metadevices for Beam Steering in the Near Infrared," Adv. Funct. Mater., 28 (10), 1704993.2018. 9 Pages.
Decker, M., et al., "Electro-optical switching by liquid-crystal controlled metasurfaces," Opt. Express, 21 (7), 8879-8885.Apr. 3, 2013. 7 Pages.
Dicken, M. J., et al., "Frequency tunable near-infrared metamaterials based on VO2 phase transition," Opt. Express, 17 (20), 18330-18339. Sep. 25, 2009. 10 Pages.
Dong, K., et al., "A Lithography-Free and Field-Programmable Photonic Metacanvas," Adv. Mater. 2018, 30 (5), 1703878.Dec. 11, 2017. 7 Pages.
Driscoll, T. et al., "Dynamic tuning of an infrared hybrid-metamaterial resonance using vanadium dioxide," Appl. Phys. Lett., 93 (2), 024101. Jul. 14, 2008. 4 Pages.
Driscoll, T., et al., "Memory Metamateriais," Science, 325 (5947), 1518-1521.Sep. 18, 2069. 5 Pages.
Ee, H.-S., et al., "Tunable Metasurface and Flat Optical Zoom Lens on a Stretchable Substrate," Nano Lett., 16 (4), 2818-2823.Mar. 17, 2016. 6 Pages.

Hashemi, M. R. M., et al., "Electronically-Controlled Beam-Steering through Vanadium Dioxide Metasurfaces," Sci. Rep., 6, 35439.Oct. 14, 2016. 8 Pages.
Homes, C. C., et al., "Effective medium approximation and the complex optical properties of the inhomogeneous superconductor K0.8 Fey $Fe_2$—y $Se_2$," Phys. Rev. B: Condens. Matter Mater. Phys., 86 (14), 144530.Oct. 24, 2012.
Horie, Y., et al., "High-Speed, Phase-Dominant Spatial Light Modulation with Silicon-Based Active Resonant Antennas," ACS Photonics2018, 5 (5), 1711-1717. Nov. 8, 2017. 7 Pages.
Hosseini, P., et al., "An optoelectronic framework enabled by low-dimensional phase-change films," Natures511 (7508), 206-211. Jul. 9, 2014. 6 Pages.
Huang, Y.-W., et al., "Aluminum Plasmonic Multicolor Meta-Hologram," Nano Lett. 15 (5), 3122-3127. Apr. 6, 2015. 6 Pages.
Huang, Y.-W. "Gate-Tunable Conducting Oxide Metasurfaces," Nano Lett. 2016, 16 (9), 5319-5325.Aug. 26, 2016. 7 Pages.
Imada, M., et al., "Metal-insulator transitions," Mod. Phys., 70 (4), 1039-1263.Oct. 1, 1998. 225 Pages.
Jang, M. S., et al., "Tunable large resonant absorption in a midinfrared graphene Salisbury screen," Phys. Rev. B: Condens. Matter Mater. Phys. 2014, 90 (16), 165409.Oct. 8, 2014. 5 Pages.
Jun, Y. C., et al., "Epsilon-Near-Zero Strong Coupling in Metamaterial-Semiconductor Hybrid Structures," NanoLett., 13 (11), 5391-5396. Oct. 14, 2013. 6 Pages.
Kafaie Shirmanesh, G., etai., "Dual-Gated Active Metasurface at 1550 nm with Wide (300°) Phase Tunability," Nano Lett., 18 (5), 2957-2963.Mar. 3, 2018. 7 Pages.
Kats, M. A., et al., "Ultra-thin perfect absorber employing a tunable phase change material" Appl. Phys. Lett. 2012, 101 (22), 221101. Nov. 26, 2012. 6 Pages.
Khorasaninejad, M., et al., "Metalenses at visible wavelengths: Diffraction-limited focusing and subwavelength resolution imagine," Science, 352 (6290), 1190-1194.Jun. 3, 2016. 6 Pages.
Kildishev, A. V., et al., "Planar Photonics with Metasurfaces," Science, 339 (6125), 1232009.Mar. 15, 2013. 8 Pages.
Kim, S., et. al., "Electronically Tunable Perfect Absorption in Graphene," Nano Lett., 18 (2), 971-979.Jan. 10, 2018. 9 Pages.
Kim, Y., et al., "Phase Modulation with Electrically Tunable Vanadium Dioxide Phase-Change Metasurfaces," Nano Lett., 19, 3961-3968.May 28, 2019. 8 Pages.
Kocer, H., et al., "Thermal tuning of infrared resonant absorbers based on hybrid gold-VO2 nanostructures" Appl. Phys. Lett., 106 (16), 161104. Published Online: Apr. 22, 2015. 5 Pages.
Komar, A., et al., "Dynamic Beam Switching by Liquid Crystal Tunable Dielectric Metasurfaces,". ACS Photonics, 5 (5), 1742-1748. Feb. 8, 2018. 7 Pages.
Lewi, T., et al., "Ultrawide Thermo-optic Tuning of PbTe Meta-Atoms," Nano Lett., 17 (6), 3940-3945.May 25, 2017. 6 Pages.
Lin, D., et al., "Dielectric gradient metasurface optical elements," Science, 345 (6194), 298-302. Jul. 28, 2014. 6 Pages.
Liu, L., et al., "Hybrid metamateriais for electrically triggered multifunctional control," Nat. Commun., 7, 13236. Oct. 27, 2016. 8 Pages.
Liu, M., et al., "Terahertz-field-induced insulator-to-metal transition in vanadium dioxide metamaterial," Nature487 (7407), 345-348.Jul. 11, 2012. 4 Pages.
Markov, P. et al., "Optically Monitored Electrical Switching in $VO_2$," ACS Photonics, 2 (8), 1175-1182.Jul. 24, 2015. 8 Pages.
Marvel, R. E., et al., "Influence of deposition process and substrate on the phase transition of vanadium dioxide thin films," Acta Mater., 91, 217-226. Available online Mar. 31, 2015. 10 Pages.
Olivieri, A., et al., "Plasmonic Nanostructured Metal-Oxide-Semiconductor Reflection Modulators," Nano Lett.15 (4), 2304-2311.Mar. 2, 2015. 8 pages.
Ou, J.-Y., et al., "An electromechanically reconfigurable plasmonic metamaterial operating in the near-infrared," Nat. Nanotechnol., 8 (4), 252-255.Published online Mar. 17, 2013. 7 Pages.
Park, J., et al., "Dynamic Reflection Phase and Polarization Control in Metasurfaces," Nano Lett. 2017, 17 (1), 407-413.Dec. 5, 2016. 7 Pages.
Park, J., et al., "Electrically Tunable Epsilon-Near-Zero (ENZ) Metafilm Absorbers," Sci. Rep. 5, 15754. Nov. 9, 2015. 9 Pages.

(56) References Cited

OTHER PUBLICATIONS

Pors, A., et al., "Gap plasmon-based metasurfaces for total control of reflected light," *Sci. Rep.*, 3, 2155.Jul. 8, 2013. 6 Pages.

Qazilbash, M. M., et al., "Mott Transition in VO2 Revealed by Infrared Spectroscopy and Nano-Imaging," Science, 318 (5857), 1750-1753. Dec. 14, 2007. 5 Pages.

Rahmani, M., et al., "Reversible Thermal Tuning of All-Dielectric Metasurface," Adv. Funct. Mater., 27 (31), 1700580. Jul. 3, 2007. 8 Pages.

Rozen, J., et al., "Two-dimensional current percolation in nanocrystalline vanadiumdioxide films," Appl. Phys. Lett., 88 (8), 081902. Published Online: Feb. 21, 2006. 4 Pages.

Sautter, J., et al., "Active Tuning of All-Dielectric Metasurfaces," *ACS Nano*, 9 (4), 4308-4315.Mar. 9, 2015. 8 Pages.

Sharoni, A., et al., "Multiple Avalanches across the Metal-Insulator Transition of Vanadium Oxide Nanoscaled Junctions," *Phys. Rev. Lett.*, 101 (2), 026404.Jul. 11, 2008. 4 Pages.

Sherrott, M. C., et al., "Experimental Demonstration of 230° Phase Modulation in Gate-Tunable Graphene—Gold Reconfigurable Mid-Infrared Metasurfaces," *Nano Lett.*, 17 (5), 3027-3034.Apr. 26, 2017. 8 Pages.

Suh, J. Y., et al., "Semiconductor to metal phase transition in the nucleation and growth of $VO_2$ nanoparticles and thin films," J. Appl. Phys., 96 (2), 1209-1213. Jun. 30, 2004. 6 Pages.

Sun, S., et al., "High-Efficiency Broadband Anomalous Reflection by Gradient Meta-Surfaces" *Nano Lett.*, 12 (12), 6223-6229.Nov. 28, 2012. 7 Pages.

Thyagarajan, K., et al., "Millivolt Modulation of Plasmonic Metasurface Optical Response via Ionic Conductance," *Adv. Mater.*, 29 (31), 1701044.Jun. 14, 2017. 8 Pages.

Tittl, A., et al., "A Switchable Mid-Infrared Plasmonic Perfect Absorber with Multispectral Thermal Imaging Capability," *Adv. Mater.*,27 (31), 4597-4603.Jul. 14, 2015. 7 Pages.

Valente, J., et al., "A magneto-electro-optical effect in a plasmonic nanowire material," Nat Commun 6, 7021. Apr. 24, 2015. 7 Pages.

Wang, Q., et al., "Optically reconfigurable metasurfaces and photonic devices based on phase change materials," Nat. Photonics 2016, 10 (1), 60-65. Dec. 21, 2015. 7 Pages.

Wu, P. C., et al., "Self-Affine Graphene Metasurfaces for Tunable Broadband Absorption," *Rev. Appl.*, 6 (4), 044019.Oct. 28, 2016. 8 Pages.

Wu, P. C., et al., "Versatile Polarization Generation with an Aluminum Plasmonic Metasurface," *P. Nano Lett.* 2017, 17 (1), 445-452.Dec. 5, 2016. 8 Pages.

Yao, Y., et al., "Broad Electrical Tuning of Graphene-Loaded Plasmonic Antennas," *Nano Lett.*, 13 (3), 1257-1264. Feb. 26, 2013. 8 Pages.

Yi, F., et al., "Voltage tuning of plasmonic absorbers by indium tin oxide," *Appl. Phys. Lett.*, 102 (22), 221102.Published online Jun. 3, 2013. 5 Pages.

Yin, X., et al., "Beam switching and bifocal zoom lensing using active plasmonic metasurfaces," *Light Sci. Appl.*, 6 (7), No. e17016. Jun. 6, 2017. 7 pages.

Yu, N., et al., "Light Propagation with Phase Discontinuities: Generalized Laws of Reflection and Refraction," *Science*, 334 (6054),Oct. 21, 2011. 333-337. 6 Pages.

Zheng, G., et al., "Metasurface holograms reaching 80% efficiency," Nat. Nanotechnol., 10 (4), 308-312. Pub online Feb. 23, 2015. 7 Pages.

Zhu, Z., et al., "Dynamically Reconfigurable Metadevice Employing Nanostructured Phase-Change Materials," *Nano Lett.*, 17 (8), 4881-4885.Jul. 21, 2017. 7 Pages.

International Search Report and Written Opinion for International Application No. PCT/US2020/013220 filed on behalf of California Institute of Technology. dated May 11, 2020. 12 pages.

International Prelimin ary Rep orton Patentability for International Application No. PCT/US2020/013220 filed on behalf of California Institute of Technology. dated Jun. 16, 2021. 8 Pages.

Arbabi, E., et al. "MEMS-tunable dielectric metasurface lens", *Nature Communications* 9, 812, (Feb. 2018). 9 pages.

Lee, H.W., et al. "Nanoscale Conducting Oxide PlasMOStor", *Nano Letters* 14, 6463-6468, (Oct. 2014). 6 pages.

Non-Final Office Action for U.S. Appl. No. 16/124,948, filed Sep. 7, 2018 on behalf of California Institute of Technology dated Apr. 24, 2020 9 pages.

Notice of Allowance for U.S. Appl. No. 16/124,948, filed Sep. 7, 2018 on behaif of California Institute of Technology dated Sep. 1, 2020 8 pages.

Saenrang, W., et al. "Deterministic and robus room-temperature exchange coupling in monodomain multiferroic BIFeO3 heterostructures", *Nature Communications* 8, 1583, (Nov. 2017). 8 pages.

She, A., et al., "Adaptive metalenses with simultaneous electrical control of focal length, astigmatism, and shift", *Science Advances* 4, eaap9957, (Feb. 2018). 8 pages.

\* cited by examiner

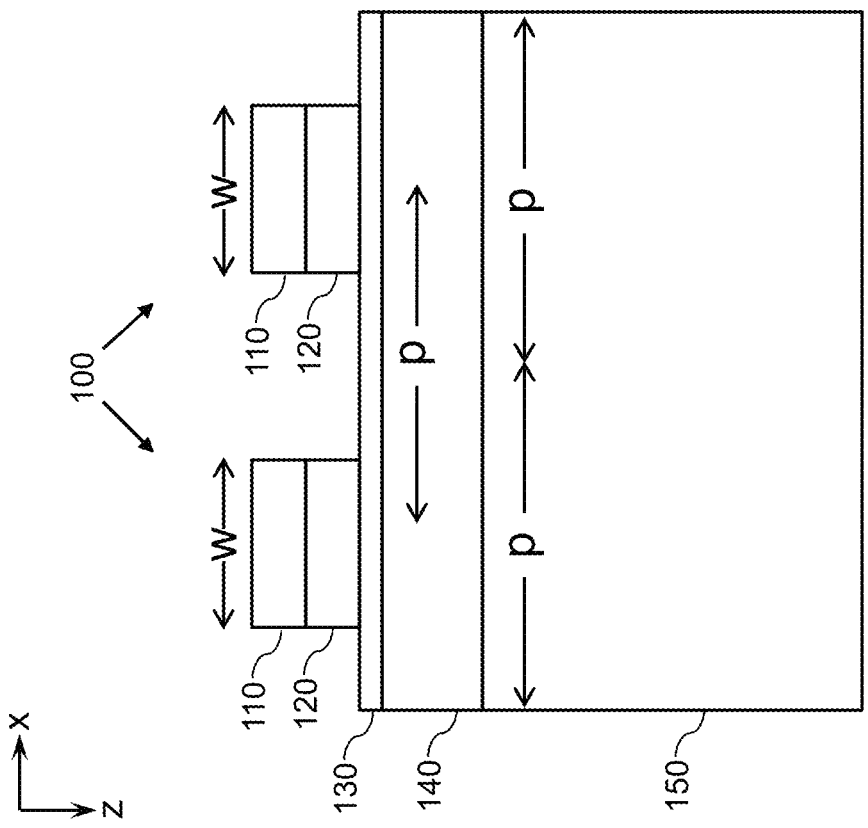
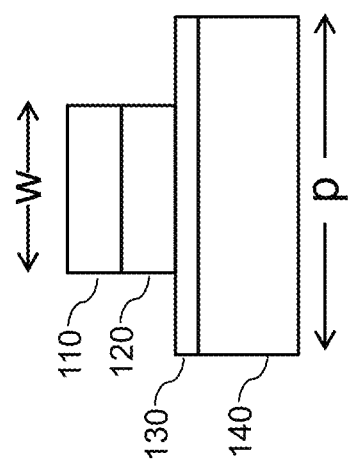
FIG. 1A
FIG. 1B

ELECTRICALLY TUNABLE METASURFACES INCORPORATING A PHASE CHANGE MATERIAL

CROSS REFERENCE TO RELATED APPLICATIONS

The present application claims priority to and the benefit of U.S. provisional patent application Ser. No. 62/792,010 entitled "Electrically Tunable Metasurfaces Incorporating a Phase Change Material", filed on Jan. 14, 2019, the disclosure of which is incorporated herein by reference in its entirety.

STATEMENT OF GOVERNMENT GRANT

This invention was made with Government support under Grant No. DE-FG02-07ER46405 awarded by the U.S. Department of Energy. The government has certain rights in the invention.

TECHNICAL FIELD

The present disclosure relates to systems and methods for providing electrically tunable optical metasurfaces, including electrically tunable phase and amplitude, using a phase change material. Applications may include novel platforms capable of providing wavefront manipulation functionality for implementation of, for example, beam steering, focusing lens, polarization control, holographic imaging, absorbers, and color filtering in a dynamically reconfigurable manner.

BACKGROUND

Optical metasurfaces are judiciously designed arrays of subwavelength optical resonators, which interact with incident light and alter the properties of the scattered electromagnetic waves such as amplitude, phase, wavelength, and polarization (e.g., Refs. [1, 2]). Optical metasurfaces have drawn attention due to their promise in replacing conventional bulky optical components with low-profile nanophotonic analogs. Moreover, a single metasurface may realize an optical function, which otherwise can only be attained by combining multiple bulky optical components. While bulky optical components tailor the wavefront of the scattered light via phase accumulation, which occurs when electromagnetic waves propagate through the given medium, metasurfaces utilize subwavelength optical scatterers (e.g., metasurface unit cells, metasurface unit elements), which tailor the wavefront of the scattered light by introducing abrupt changes in the properties of the scattered light at subwavelength scale.

Metasurfaces have been designed to realize a number of optical components such as anomalous reflectors (e.g., per Refs. [4, 5], focusing lenses/mirrors (e.g., Refs. [6, 7]), polarization convertors (e.g., Refs. [3, 8, 9]) and holographic plates (e.g., Refs. [10-12]). However, these metasurfaces are passive, so their optical response cannot be dynamically changed after fabrication. The desire to dynamically control the key constitutive properties of light at subwavelength scale has given rise to a burgeoning field of active metasurfaces. While there are numerous reports of active amplitude control for scattered light, experimental demonstrations of dynamic phase control are rare.

Both phase and amplitude control are required to achieve many important applications for dynamically tunable metasurfaces such as, for example, chip-scale beam steering devices for light detection and ranging (LiDAR) systems, reconfigurable metalenses, and 3D holographic displays. The optical response of active metasurfaces can be dynamically changed upon application of external stimuli such as heat or electrical bias (voltage, current).

Previous research has created active metasurfaces by employing a number of physical phenomena such as thermo-optic effects in semiconductors (e.g., Refs. [13-15]); field effect in indium tin oxide (e.g., Refs. [16-20]), gallium arsenide (e.g., Ref [21]), silicon (e.g., Ref. [22] and graphene (e.g., Refs. [23-28]); phase transitions in germanium antimony telluride (GST) (e.g., Refs. [29-34]) and vanadium dioxide ($VO_2$) (e.g., Refs. [35-44]); and reorientation of liquid crystal molecules (e.g., Refs. [45-48]), ionic transport (e.g., Ref. [49]), and mechanical deformations (e.g., Refs. [50-52]). A challenge for the field of active metasurfaces is the realization of comprehensive active control of both amplitude and phase of the scattered electromagnetic waves. However, most reports of active control have demonstrated amplitude modulation, whereas experimental demonstrations of dynamic control of the phase of scattered electromagnetic waves are much less common (e.g., Refs. [15, 18-20, 27, 29, 31-33, 39, 44, 47, 52]).

Continuous active control of phase variation of the scattered light throughout the spatial extent of a metasurface would enable complex wavefront engineering, enabling the manipulation of the properties of the scattered light. For example, prior research has reported a metasurface-based dynamic phase grating by temporally varying the spatial phase profile of the electromagnetic waves reflected from the metasurface (e.g., Ref. [19]). This enabled demonstration of electrical bias-actuated dynamic beam switching. Hence, from the point of view of future potential application, electrically tunable metasurfaces are especially interesting since they enable individual addressability to metasurface (unit) elements, holding promise to realize complex wavefront control.

Vanadium dioxide ($VO_2$) is a well-known phase change material, which undergoes a reversible insulator-to-metal transition upon heating (e.g., Ref. [53]). The phase transition of $VO_2$ is accompanied by a large change in complex refractive index over a broad spectral range. The insulator-to-metal transition in $VO_2$ occurs at a temperature of Tc~340 K (e.g., Ref [54]) which is close to room temperature. This makes $VO_2$ a promising candidate for energy-efficient devices. While $VO_2$-based tunable metasurfaces (e.g., Refs. [35-44]) have been previously demonstrated, in the majority of these works, the insulator-to-metal transition in $VO_2$ was induced either by direct heating (e.g., Refs. [29-21, 35-39]) or optical pumping (e.g., Refs. [32, 33, 40]). A limited number of works have reported electrically tunable $VO_2$-based metasurfaces operating at near-infrared (e.g., Ref. [43], mid-infrared (e.g., Ref. [42]), or far-infrared (e.g., Ref. [41]) wavelengths. Although the electrical tuning mechanism is still induced by heating, the electrical controllability is essential to realize devices with complex functionalities such as, for example, phased array systems for beam steering applications, which require individual control of metasurface elements (e.g., Ref. [19]). These works, however, report only the intensity modulation/control of the scattered light and do not demonstrate phase modulation/control at optical frequencies (e.g., wavelength of 100 nm to 1 mm). While a prior work has shown an electrically tunable phase of electromagnetic waves transmitted through the $VO_2$-based metasurface, the operation wavelength is on the order of millimeters (e.g., Ref. [44]). The applications for the metasurface according to the present disclosure, such as LiDAR or holographic displays, require the metasurface operation wavelength to be in the near-infrared wavelength ranges (e.g., wavelength of 800 nm to 2000 nm). It is worth mentioning that besides $VO_2$, previous works have used amorphous-to-crystalline switching in GST to demonstrate active phase change metasurfaces (e.g., Refs. [29-34]). While a number of works on $VO_2$ (e.g., Refs. [39, 44]) or GST-based (e.g., Refs. [29, 31-33]) active metasurfaces have benefited from the phase difference of the scattered light, an actively controlled continuous phase shift of near-infrared electromagnetic waves scattered by $VO_2$ or GST-based active metasurfaces has not been demonstrated.

Teachings according to the present disclosure relate to electrically tunable metasurface unit elements that allow dynamic control of phase and amplitude of reflected light. Such unit elements may be arranged as part of dynamically tunable reflectarray metasurfaces (e.g., antenna with reflective metasurface unit elements) that can continuously modulate the phase and amplitude of the reflected light in a wavelength range that can include, for example, the near-infrared wavelength range (e.g., 800 nm to 2000 nm).

SUMMARY

A dynamically tunable (reflectarray) metasurface that continuously modulates the phase of reflected light, including in the near-infrared wavelength range (e.g., 800 nm to 2000 nm), under electrical control of an active layer comprising a phase transition material that transitions from a semiconducting state to a semimetallic state is presented.

According to an exemplary embodiment of the present disclosure, the active layer, which undergoes an insulator-to-metal transition upon resistive (i.e., Joule) heating, is arranged into a dielectric gap (between metal/conductive layers) of unit elements of the reflectarray metasurface.

According to an exemplary embodiment of the present disclosure, the active layer may be a layer of vanadium dioxide ($VO_2$) material. According to other exemplary embodiments, the active layer may be made of any of a number of chalcogenide compounds such as, for example, GeSbTes (e.g., a ternary compound of germanium, antimony, and tellurium).

The induced phase transition in the active layer of the metasurface according to the present disclosure perturbs a magnetic dipole resonance supported by the metasurface. By carefully controlling volume fractions of coexisting metallic and dielectric regions of the active layer, a continuous shift of a phase of the reflected light is provided, with a maximal achievable phase shift equal to, or larger than, 180 degrees and as high as 250 degrees for certain wavelengths of operation. Furthermore, reflectance modulation of 23.5% as well as a spectral shift of the resonance position by 175 nm can be observed. Accordingly, the metasurface phase modulation is fairly broadband, yielding in large phase shifts at multiple operation wavelengths, including in near-infrared wavelength ranges (e.g., 800 nm to 2000 nm).

According to one embodiment the present disclosure, an electrically tunable metasurface, is presented, the electrically tunable metasurface comprising: an array of subwavelength metasurface unit elements, each unit element comprising: a bottom conductive layer; an insulating layer overlying the bottom conductive layer; an active layer overlying the insulator layer; and a top conductive layer overlying the active layer, wherein the active layer comprises a phase change material having a phase controllable via resistive heating produced by a flow of a control current through the top conductive layer of the unit elements.

According to a second embodiment of the present disclosure, an electrically tunable metasurface is presented, the electrically tunable metasurface comprising: an array of subwavelength metasurface unit elements, each unit element comprising: a bottom conductive layer; an insulating layer overlying the bottom conductive layer; an active layer overlying the insulator layer; and a top conductive layer overlying the active layer, wherein the active layer comprises a phase change material having a phase controllable via an electric field produced by a voltage differential between the top conductive layer and the bottom conductive layer of the unit elements.

Further aspects of the disclosure are shown in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure. Same reference designators refer to same features.

FIG. 1A shows a cross sectional view of an electrically tunable metasurface unit element incorporating a phase change material according to an embodiment of the present disclosure.

FIG. 1B shows a cross sectional view of two adjacent electrically tunable metasurface unit elements of FIG. 1A fabricated on a substrate.

DETAILED DESCRIPTION

Figure 1C:
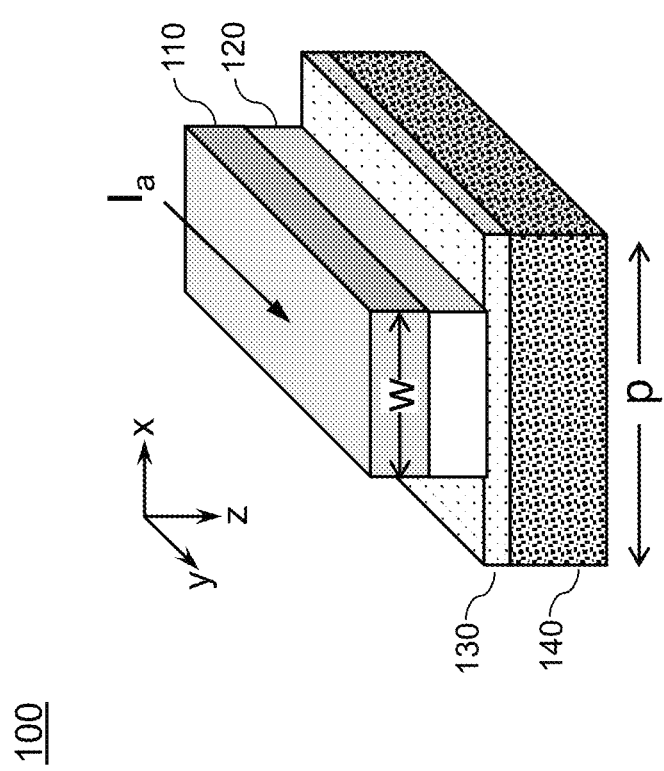
FIG. 1C shows a perspective view of the electrically tunable metasurface unit element of FIG. 1A, including a control current flowing through a top metal layer of the unit element.

FIG. 1A shows a cross sectional view (e.g., in (x, z) plan) of an electrically tunable metasurface unit element (100)

incorporating a phase change material (e.g., part of layer 120) according to an embodiment of the present disclosure. As can be seen in FIG. 1A, such unit element (100) includes a stacked layer configuration according to a metal-insulator-metal (MIM) structure, including a top metal layer (110), a bottom metal layer (140) and a middle insulating layer (130). Furthermore, an active phase change layer (120) made of a phase change material whose optical properties can be changed upon application of an external stimulus, is provided between the top metal layer (110) and the middle insulating layer (130). In particular, the external stimulus may control volume fractions of coexisting metallic (conductor) and dielectric (insulator) regions of the active phase change layer (120), thereby control an effective insulator thickness of the MIM structure provided by the unit element (100).

With further reference to FIG. 1A, the MIM structure of the unit element (100) can support a magnetic dipole resonance under transverse magnetic (TM) excitation. It should be noted that other embodiments may be envisioned wherein the supported resonance is an electric dipole resonance or a higher order resonant mode instead of the magnetic dipole resonance.

According to an embodiment of the present disclosure, each of the (conductive) top metal layer (110) and the (conductive) bottom metal layer (140) of the unit element (100) shown in FIG. 1A is selected to support plasmon resonance. Accordingly, each of the layers (110) and (140) can be made of, or include, any one or a combination of: i) a metal, such as silver, copper, aluminum, gold; ii) or a semiconductor, such as gallium arsenide (GaAs), silicon (Si); iii) or a transparent conducting oxide (e.g., indium tin oxide (ITO), aluminum-doped zinc oxide (AZO), aluminum-doped zinc oxide (GZO), etc.); iv) or a transition metal nitride (e.g., titanium nitride (TiN), zirconium nitride (ZrN), etc.).

According to an embodiment of the present disclosure, the (non-conductive) insulating layer (130) of the unit element (100) shown in FIG. 1A can comprise one of, or a combination of, aluminum oxide, silicon oxide, titanium dioxide and silicon nitride. According to an embodiment of the present disclosure, material of the insulating layer (130) may support growth of the phase change material used in the active phase change layer (120) via deposition processes known to a person skilled in the art, such as, for example, an evaporative deposition (e-beam or thermal) process, sputtering or any suitable chemical vapor deposition (CVD) techniques. Accordingly, when the active phase change layer (120) is made of, for example, $VO_2$, such layer $VO_2$ may be grown onto the insulating layer (130).

According to an exemplary embodiment of the present disclosure, the layers (110), (120), (130) and (140) of the unit element (100) shown in FIG. 1A are respectively made of gold (Au), vanadium dioxide ($VO_2$), aluminum oxide ($Al_2O_3$), and gold (Au).

According to another exemplary embodiment of the present disclosure, the layers (110), (120), (130) and (140) of the unit element (100) shown in FIG. 1A are respectively made of gold (Au), vanadium dioxide ($VO_2$), silicon dioxide ($SiO_2$), and gold (Au). In such configuration, the insulating layer (130) can be made of a material (i.e., $SiO_2$) with low thermal conductivity to mitigate thermal crosstalk between adjacent unit elements (e.g., per FIG. 1B, FIG. 2 and FIG. 4). This allows individual/distinct control of the adjacent unit elements with reduced thermal crosstalk, wherein heat dissipation for the adjacent unit elements can be provided through a conductive base substrate (e.g., 150 of FIG. 1B) upon which the adjacent unit cells are fabricated.

FIG. 1B shows a cross sectional view of two of the electrically tunable metasurface unit elements (100) of FIG. 1A fabricated on a substrate (150). According to an embodiment of the present disclosure, the substrate (150) may be fabricated of, or include a, conductive material. As can be seen in FIG. 1B, the unit elements (100) may share a common bottom metal layer (140) and a common insulating layer (130) that are sequentially formed/staked on top of the substrate (150). In other words, the bottom metal (conductive) layer (140) and the insulating layer (130) of the unit elements (100) are part (or form) respective contiguous layers (140, 130 shown in FIG. 1B) that are common to the unit elements (100). In turn, layers (120) and (110) of each of the two unit elements (100) may be formed atop the common insulating layer (130). It should be noted that any known in the art suitable fabrication method can be employed to produce the subwavelength features of the unit elements (100), combined as necessary with known in the art film deposition and etching techniques, including, for example, Electron beam lithography; optical lithography such as, for example, ultraviolet (UV), deep ultraviolet (DUV), extreme ultraviolet (EUV); Ion beam lithography; and Soft lithography. It should also be noted that such fabrication method can be used to form a plurality of unit elements (100) to form a reflectarray metasurface with tunable control of phase and amplitude response as shown, for example, in FIG. 2 and FIG. 4 later described.

According to an exemplary embodiment of the present disclosure, a fabrication process of the unit elements (100) shown in FIG. 1B (and FIG. 2, FIG. 4) may include the following known in the art steps: i) depositing the bottom metal layer (140) on a substrate (150) having an adhesion layer (e.g. Ti or Cr). The bottom metal layer (140) can be grown by an appropriate deposition process, such as an evaporative deposition (e-beam or thermal) process or sputtering; ii) forming the insulating layer (130) on top of the bottom metal layer by any suitable techniques such as sputtering, evaporation, low pressure chemical vapor deposition (LPCVD), plasma enhanced chemical vapor deposition (PECVD) or atomic layer deposition (ALD); iii) growing the active layer (e.g., $VO_2$) (120) on the insulating layer (130) using any suitable technique, such as LPCVD, PECVD, atomic layer deposition (ALD), sputtering a sol-gel process or PLD. A corresponding pattern may be written on a positive electron beam resist using electron-beam lithography, and the pattern may be developed in a resist developer; iv) depositing the top metal layer (110) followed by a hard mask layer on the developed resist using electron beam deposition; v) forming the designed patterns via a lift-off process; vi) using the patterned top layer as a hard mask for dry etching of the active layer (120) and yielding self-aligned MIM metasurface elements of an antenna array (e.g., reflectarray); and vii) selectively removing the hard mask by a brief dry etching process that employs etchants which selectively etch the material of the active layer (120) (e.g., $VO_2$) and the hard mask respectively.

FIG. 1C shows a perspective view of the electrically tunable metasurface unit element (100) of FIG. 1A, including an externally provided control current (Ia) flowing through the strip shaped top metal layer (110) of the unit element (100). The phase transition material (e.g., $VO_2$) in the active layer (120) may be thermally induced via resistive (Joule) heating of the top metal layer (110) using the control current (Ia). This can allow precise control of the temperature of the phase transition material of the active layer (120).

Because the phase transition material is incorporated directly into the MIM structure of the unit element (100), enhanced interaction between such active material and a strongly confined (magnetic) field within the structure can be obtained. When used as metasurface elements of an antenna array (e.g., per FIG. 2 and FIG. 4), strong light-matter interaction in the resonance cavity of the metasurface unit elements (100) may result in large phase shifts of reflected light induced by the significant change in the resonance of the unit elements (100). Furthermore, continuous phase shifts (e.g., 0 to 250 degrees) can be obtained by utilizing phase coexistence (i.e., insulator and metal) of the phase change material (e.g., $VO_2$) of the active layer (120) via gradual resistive (Joule) heating, which provides intermediate optical properties near the insulator-to-metal transition.

Figure 1E:
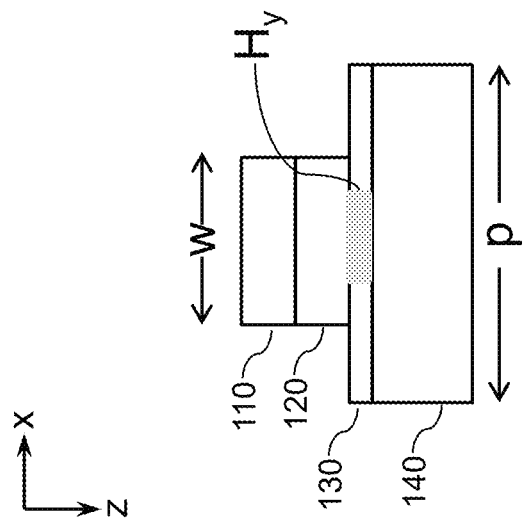
FIG. 1E shows spatial concentration of the magnetic field in the electrically tunable metasurface unit element of FIG. 1A when the phase change material is in metallic phase.
Figure 1D:
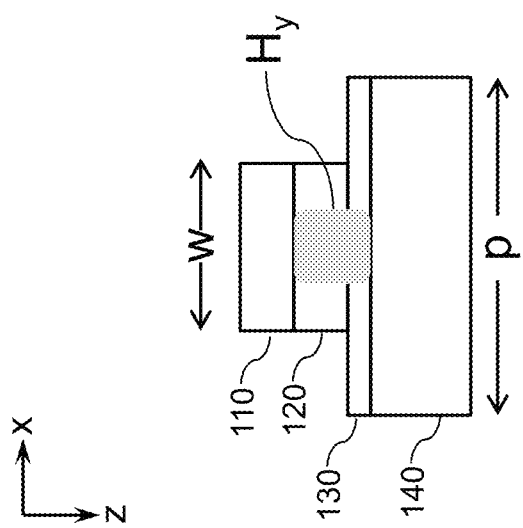
FIG. 1D shows spatial concentration of the magnetic field in the electrically tunable metasurface unit element of FIG. 1A when the phase change material is in insulating phase.

FIG. 1D shows spatial concentration of the magnetic field, Hy, in the electrically tunable metasurface unit element (100) of FIG. 1A when the phase change material (e.g., $VO_2$) of the active layer (120) is in insulating phase. When the phase change material is in the insulating phase, the incident plane wave excites a magnetic dipole resonance of the unit element (100) in the near-infrared, such as for example at a wavelength λ=1520 nm. As seen in FIG. 1D, the magnetic field, Hy, is concentrated between the bottom metal layer (140) and the top metal layer (110) in a region formed by insulating material (or material phase) of the layers (120) and (130) and away from conductive regions formed by the metal layers (110, 140). Alternately, as shown in FIG. 1E, when the phase change material (e.g., $VO_2$) of the active layer (120) is in the metallic phase, the magnetic field, Hy, is mainly confined in the insulating layer (130) as the effective thickness of dielectric (insulator) provided by the layers (120, 130) decreases. The change in the near-field characteristics of the supported resonance mode in each of the two figures is accompanied by large changes in the amplitude and the phase of the reflected light as shown, for example, in FIG. 3A and FIG. 3B later described.

Figure 2:
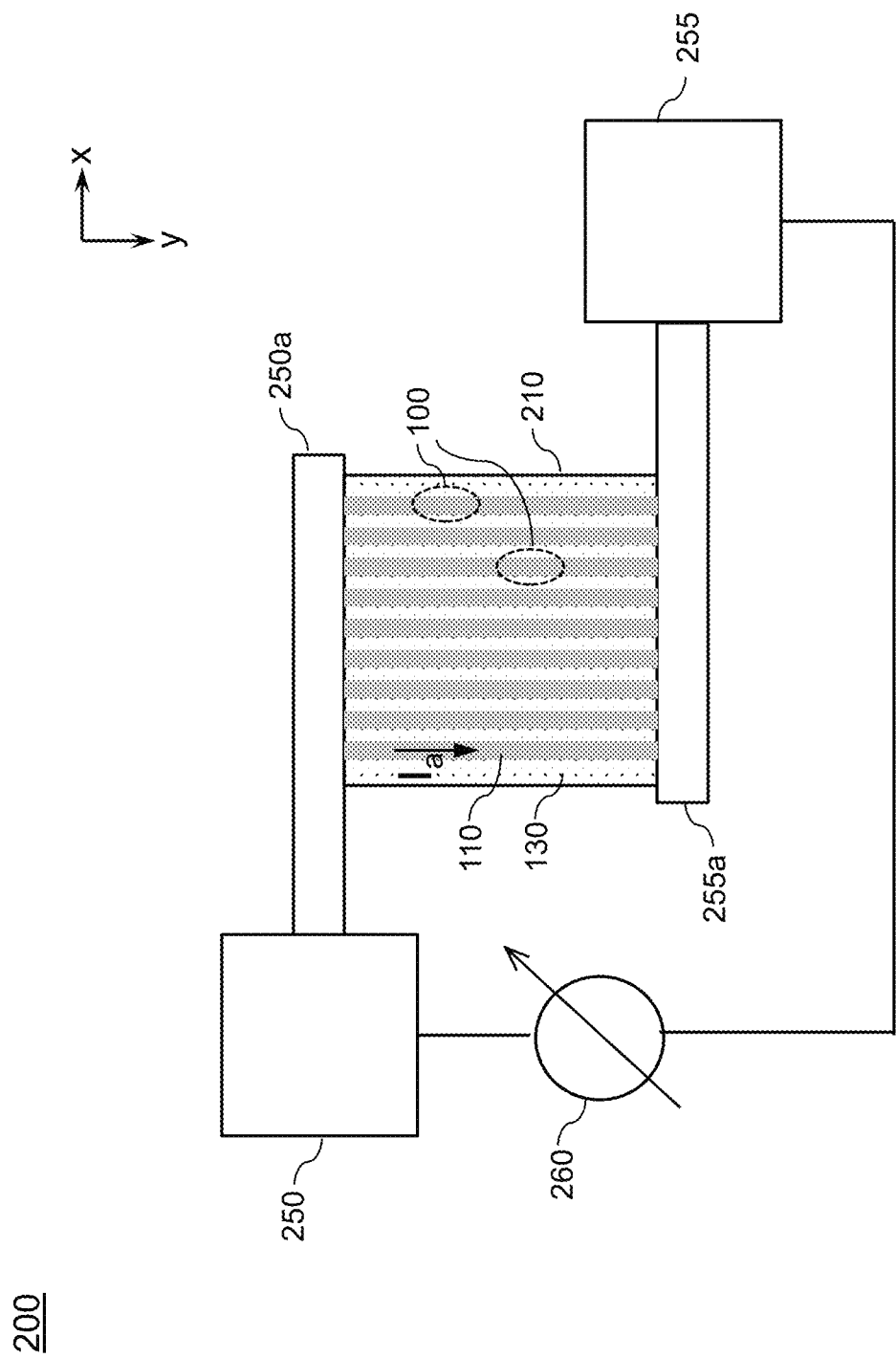
FIG. 2 shows a plan view of an electrically tunable metasurface according to an embodiment of the present disclosure comprising an array of a plurality of electrically tunable metasurface unit elements according to FIG. 1A coupled to a pair of contact pads for a same electrical control of the metasurface unit elements.

FIG. 2 shows a plan view (e.g., (x, y) plan) of an electrically tunable metasurface (200) according to an embodiment of the present disclosure comprising an array (210) of a plurality of electrically tunable metasurface unit elements (100) according to FIG. 1A coupled to a pair of contact pads (250, 255) for a same/uniform electrical control of the metasurface unit elements (100). By connecting an electrical bias supply (260), such as for example a variable voltage source or a variable current source, across the two contact pads (250, 255) as shown in FIG. 2, a control current Ia that flows through the top metal layer (110) of each of the unit elements (100) can be produced. Accordingly, local heat can be produced into the active layers (120) of each of the unit elements (100). Furthermore, by varying an output (voltage or current) of the electrical bias supply (260), controlled gradual heating of the active layers (120) can be provided, which in turn can dynamically control phase and amplitude response of the electrically tunable metasurface (200). It should be noted that being a plan view, FIG. 2 does not show the active layers (120) which can be seen, for example, in FIG. 1B, for a case of two adjacent unit elements (100) of the electrically tunable metasurface (200).

With continued reference to FIG. 2, the two contact pads (250) and (255) may be respectively coupled to two ends of each of the top metal layers (110) of the unit elements (100) via respective contact pad extensions (250a) and (255a). In other words, the contact pad extension (250a) provides connection between the contact pad (250) and one end of the strip shaped top metal layers (110), and the contact pad extension (255a) provides connection between the contact pad (255) and the other end of the strip shaped top metal layers (110). It should be noted that presence of the contact pad extensions (255a, 255a) may be optional as the contact pads (250, 255) may be designed for direct connection to the top metal layers. It should also be noted that shapes of the contact pads (250, 255) and the contact pad extensions (250a, 255a) may be any suitable shape for providing flow of the current Ia from the electrical bias supply (260) through the top metal layers (110).

With continued reference to FIG. 2, a person skilled in the art would realize that optical response of the electrically tunable metasurface (200) may be a function of a width w, period p, and thickness of the layers (110, 120, 130, 140) of the unit element (100) shown in FIG. 1A which are typically smaller (e.g., subwavelength) than an operating wavelength of the metasurface (200). In particular, the electrically tunable metasurface (200) can be made to operate at wavelengths ranging from optical wavelengths (e.g., wavelength of 100 nm to 1 mm) to millimeter wavelengths (e.g., wavelength of 1 mm to 10 mm) by designing the dimension of the unit element (100) according to methods/equations known in the art.

With further reference to FIG. 2, according to an exemplary embodiment of the present disclosure, for operation at a wavelength in a range of 1200 nm to 2000 nm, for each of the constituent unit elements (100), the width w may be equal to 210 nm, the period p may be equal to 400 nm, the thickness of the top metal layer (110) may be 40 nm, the thickness of the active layer (120) may be 40 nm, thickness of the insulating layer (130) may be 50 nm, and thickness of the bottom metal layer (140) may be 150 nm. According to an exemplary embodiment of the present disclosure, the total area of the array (210) may be about 100 μm×100 μm which larger than a spot size of an incident beam of light during operation. For such configuration, a continuous phase shift of the reflected light ranging from 0 degrees to 180 degrees can be provided by the electrically tunable metasurface (200). In particular, a maximal phase shift of 250 degrees can be provided in a wavelength of operation that spans from 1515 nm to 1575 nm. A person skilled in the art would clearly understand that the exemplary dimensions/sizes provided herewith for operation in the wavelength range of 1200 nm to 2000 nm may be scaled up/down for operation at different wavelengths.

Figure 3B:
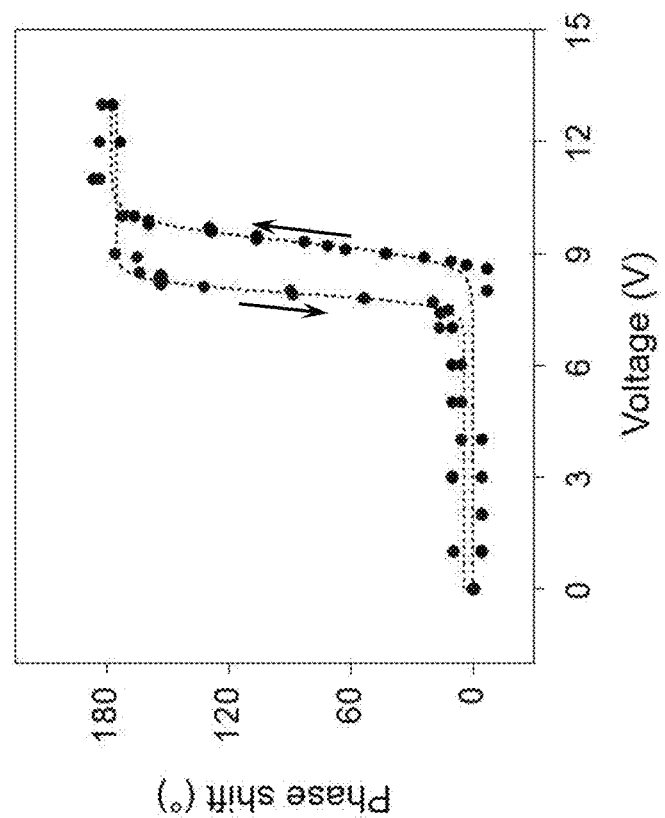
FIG. 3B shows a graph representing measured phase shift for different applied control voltages of the electrically tunable metasurface shown in FIG. 2.
Figure 3A:
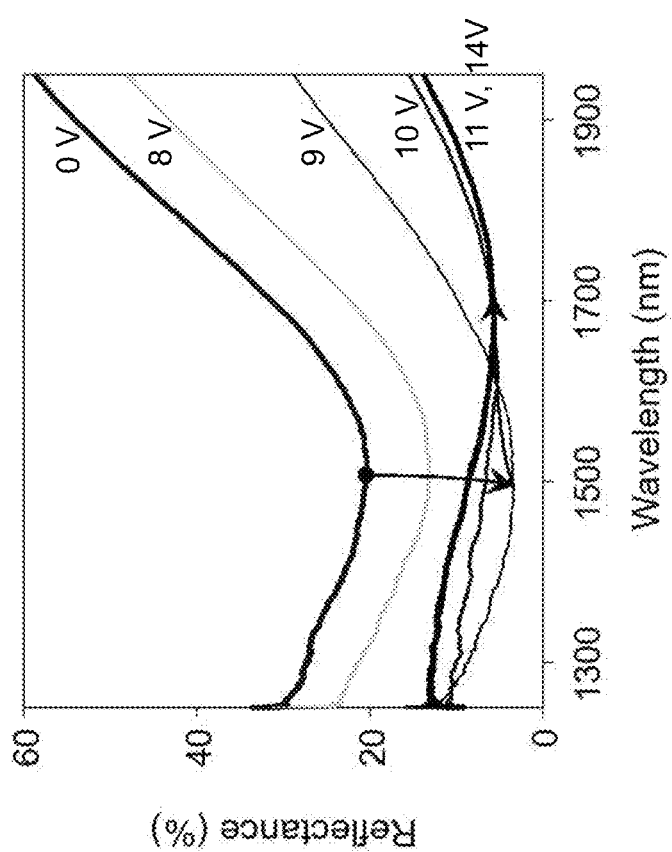
FIG. 3A shows a graph representing measured reflectance spectra for different applied control voltages of the electrically tunable metasurface shown in FIG. 2.

FIG. 3A shows a graph representing measured reflectance spectra at different operating wavelengths (e.g., 1250 nm to 1950 nm) for different applied control voltages (e.g., 0 V to 14 V) of the electrically tunable metasurface (200) shown in FIG. 2. In particular, as can be seen in FIG. 3A (indicated by arrow from 0 volts curve to 9 volts curve), for a wavelength of the incident light of about 1510 nm, the reflectance can change (be modulated) by about 20% when the applied control voltage changes from 0 volts, which corresponds to a purely insulating phase of the active layer (120), to 9 volts, which corresponds to a coexisting metal and insulator phase of the active layer (120).

FIG. 3B shows a graph representing measured phase shift for different applied control voltages (e.g., 0 V to 13 V) of the electrically tunable metasurface (200) shown in FIG. 2, based on an incident light with a wavelength of 1550 nm. A person skilled in the art would appreciate the continuously tunable phase shift provided by the electrically tunable metasurface (200) as a function of applied voltage via the electrical bias supply (260) shown in FIG. 2. As can be seen in the graph of FIG. 3B, there is a reversible voltage-dependent hysteresis loop in the phase shift response. As can be seen in FIG. 3B, by increasing the control voltage from 0 volts, corresponding to a purely insulating phase of the active layer (120), phase shift remains flat up to a control voltage of approximately 9 volts which corresponds to a threshold voltage for transition from the purely insulating phase of the active layer (120) to a coexisting metal and insulator phase of the active layer (120). Further increase of the control voltage produces pronounced variation of the phase shift according to a relatively steep slope up to a control voltage of about 11 volts which corresponds to a threshold voltage for transition to a purely metallic phase of the active layer (120), after which no further variation of the phase shift is observed. On the other hand, as can be seen in FIG. 3B, by decreasing the control voltage from 13 volts to 0 volts, a reverse sequence of transitions of the phases of the active layer (120) is observed at control voltages of about 9 volts and 8 volts, thereby producing the voltage-dependent hysteresis loop shown in the figure.

Figure 4:
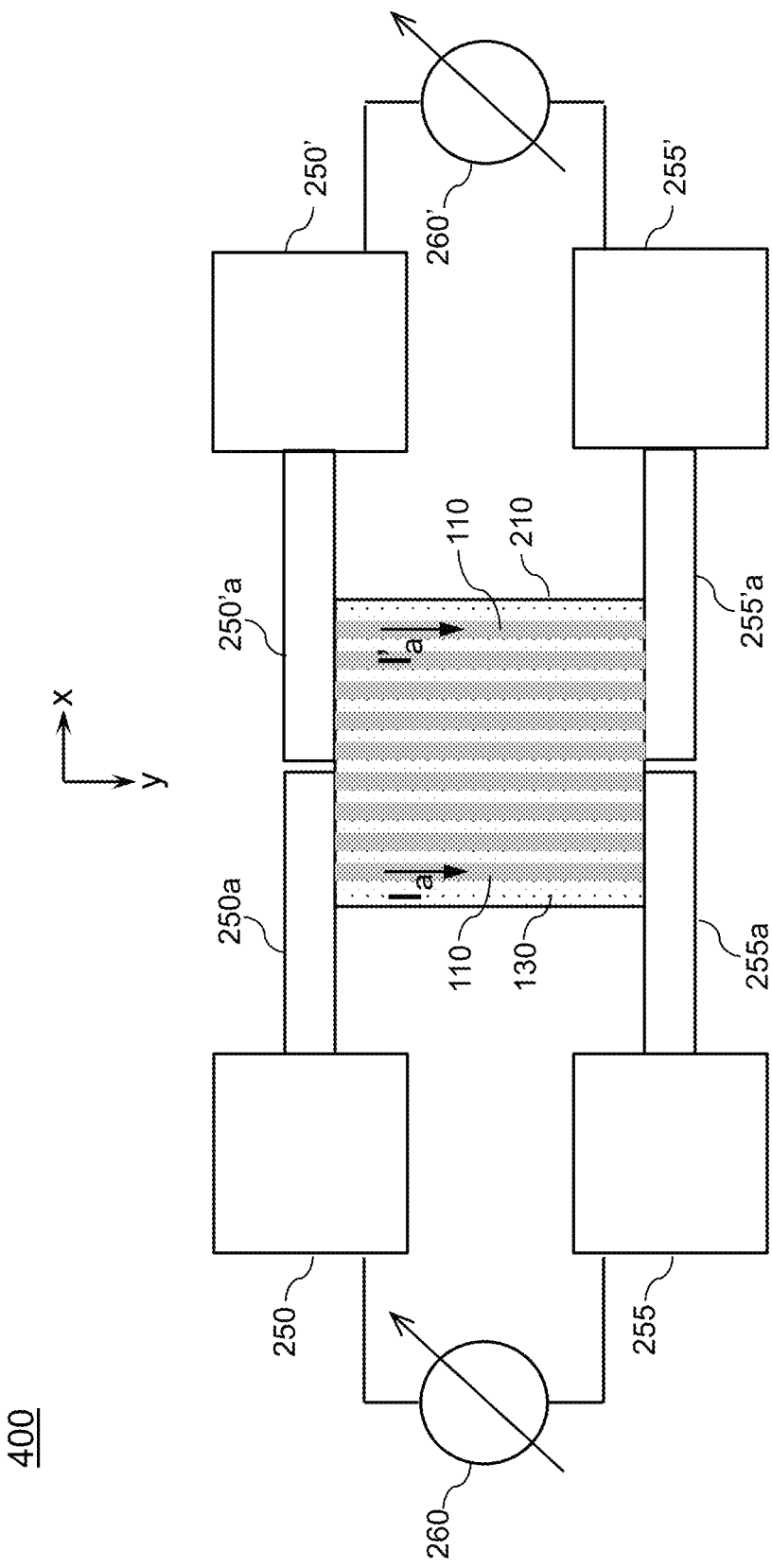
FIG. 4 shows a plan view of an electrically tunable metasurface according to another embodiment of the present disclosure comprising an array of a plurality of electrically tunable metasurface unit elements according to FIG. 1A coupled to a plurality of (e.g., two) contact pads for different electrical controls of different groups of the metasurface unit elements.

FIG. 4 shows a plan view (e.g., (x, y) plan) of an electrically tunable metasurface (400) according to an embodiment of the present disclosure comprising an array (210) of a plurality of electrically tunable metasurface unit elements (100) according to FIG. 1A coupled to different pairs of contact pads (250, 255) and (250', 255') for provision of different/non-uniform electrical control of the metasurface unit elements (100). In particular, as can be seen in FIG. 4, each of the two pairs of contact pads (250, 255) and (250', 255') provides electrical control to two different (non-overlapping) groups of the metasurface unit elements (100). Accordingly, an optical response of a first group of the metasurface unit elements (100) whose top metal layers (110) are electrically coupled to a first electrical bias supply (260) can be controlled independently from an optical response of a second group of the metasurface unit elements (100) whose top metal layers (110) are electrically coupled to a second electrical bias supply (260'). Accordingly, the first and the second electrical bias supply (260) and (260') can provide flow of a respective control current Ia and I'a through the top metal layers (110) of the first and second groups of metasurface unit elements (100).

A person skilled in the art would clearly understand that the configuration shown in FIG. 4 can be expanded to any number of distinct/separate/non-overlapping groups of metasurface unit elements (100), each such group comprising one or more such unit elements (100) arranged in a sequence (e.g., adjacent to one another) or interspersed (e.g., non-adjacent) within the array (210). It should also be noted that a person skilled in the art would clearly understand that other aspects related to principle of operation of the electrically tunable metasurface (400) can be taken from the description above with reference to, for example, FIG. 1B and FIG. 2. Furthermore, although separate electrical bias supplies (e.g., 260, 260') coupled to different groups of unit elements (100) are shown in FIG. 4, a person skilled in the art would know of many alternative design implementations for providing different control currents (e.g., Ia, I'a) to the different groups of unit elements (100) which do not necessarily require different electrical bias supply units. Some such alternative designs may include a single electrical supply unit for provision of a reference voltage/current to an electrical circuit which may generate therefrom the different control currents.

It should be noted that according to an embodiment of the present disclosure, the resistive (Joule) heating of the metasurface unit elements (100) via electrical current conductance through the top metal layers (110) as described above may be substituted, as shown in FIG. 5, with electrical field effect by applying an electric field (e.g., shown as arrows in FIG. 5, controlled by a voltage source 560) between the top metal layer (110) and the bottom metal layer (140). In such configuration, the stacked metal-insulator-metal structure of the metasurface unit elements (100) operate as a capacitor with an electrical field generated between the two metal plates (top and bottom metal layers 110, 140) that is proportional to the voltage differential applied, via the (variable) voltage source (560) between the two plates.

Figure 5:
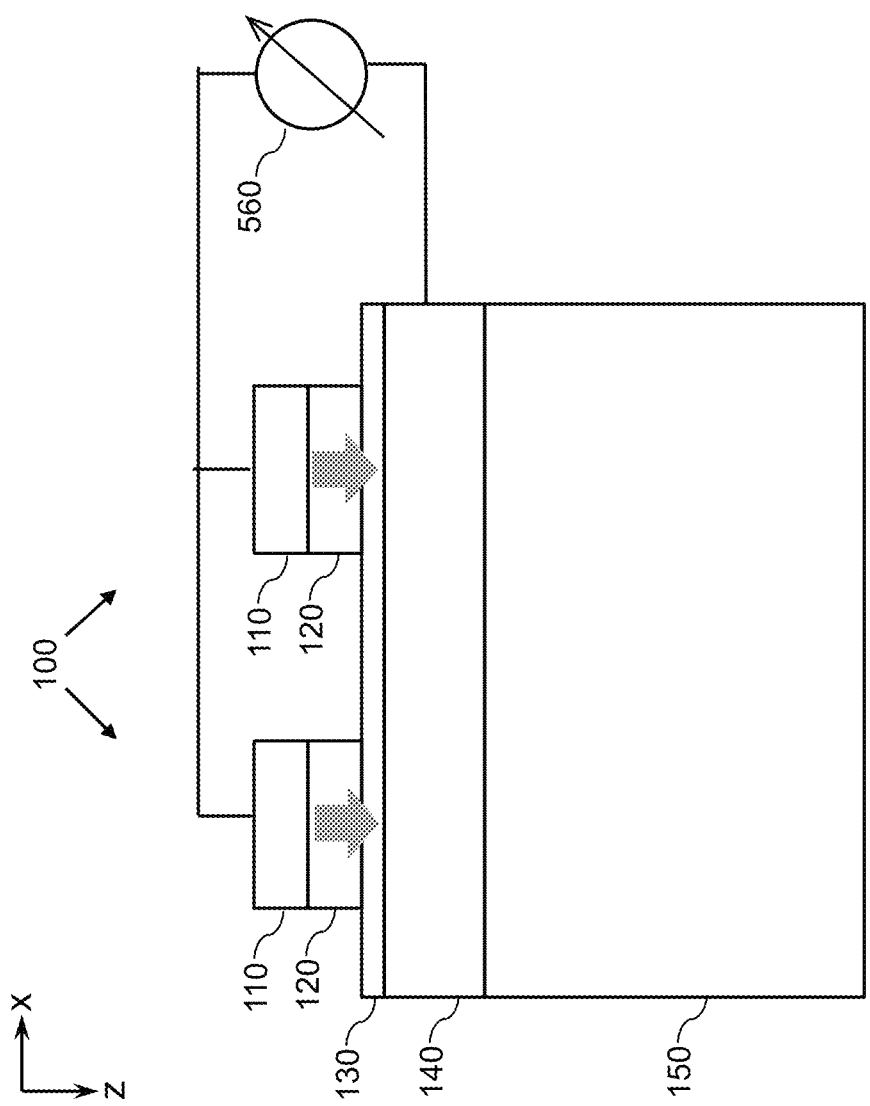
FIG. 5 shows an electrically tunable metasurface according to another embodiment of the present disclosure comprising an array of a plurality of electrically tunable metasurface unit elements according to FIG. 1A that are controlled via an electric field.

With continued reference to FIG. 5, by increasing/decreasing the voltage differential, the electric field can be controlled, which in turn controls a phase of the active layer (120) to purely insulating, purely metal or coexisting metal and insulator, thereby controlling the optical response (e.g., amplitude/reflectance and phase shift) of the metasurface unit elements (100) as described above with reference to FIGS. 3A and 3B. A practical implementation of such configuration may be derived from FIG. 2 by coupling the contact pad (250) and corresponding optional contact pad extension (250a) to any of the two sides/ends of the top metal layers (110), and coupling the contact pad (255) and corresponding optional contact pad extension (255a) to any region of the bottom metal layer (not necessarily end regions as shown in FIG. 2). Another practical implementation of such configuration may be derived from FIG. 4 by coupling the contact pads (250, 250') and corresponding optional contact pad extension (250a, 250'a) to any of the two sides/ends of the two (or more) different groups of top metal layers (110), and coupling the contact pads (255, 255') and corresponding optional contact pad extension (255a, 255'a) to any region of the bottom metal layer (not necessarily end regions as shown in FIG. 4).

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The references in the present application, shown in the reference list below, are incorporated herein by reference in their entirety.

REFERENCES

[1] Yu, N.; Genevet, P.; Kats, M. A.; Aieta, F.; Tetienne, J.-P.; Capasso, F.; Gaburro, Z. *Science* 2011, 334 (6054), 333-337.
[2] Kildishev, A. V.; Boltasseva, A.; Shalaev, V. M. *Science* 2013, 339 (6125), 1232009.
[3] Arbabi, A.; Horie, Y.; Bagheri, M.; Faraon, A. *Nat. Nanotechnol.* 2015, 10 (11), 937-943.
[4] Sun, S.; Yang, K.-Y.; Wang, C.-M.; Juan, T.-K.; Chen, W. T.; Liao, C. Y.; He, Q.; Xiao, S.; Kung, W.-T.; Guo, G.-Y.; et al. *Nano Lett.* 2012, 12 (12), 6223-6229.
[5] Pors, A.; Albrektsen, O.; Radko, I. P.; Bozhevolnyi, S. I. *Sci. Rep.* 2013, 3, 2155.
[6] Lin, D.; Fan, P.; Hasman, E.; Brongersma, M. L. *Science* 2014, 345 (6194), 298-302.
[7] Khorasaninejad, M.; Chen, W. T.; Devlin, R. C.; Oh, J.; Zhu, A. Y.; Capasso, F. *Science* 2016, 352 (6290), 1190-1194.
[8] Wu, P. C.; Tsai, W.-Y.; Chen, W. T.; Huang, Y.-W.; Chen, T.-Y.; Chen, J.-W.; Liao, C. Y.; Chu, C. H.; Sun, G.; Tsai, D. P. *Nano Lett.* 2017, 17 (1), 445-452.
[9] Black, L.-J.; Wang, Y.; de Groot, C. H.; Arbouet, A.; Muskens, O. L. *ACS Nano* 2014, 8 (6), 6390-6399.
[10] Chen, W. T.; Yang, K.-Y.; Wang, C.-M.; Huang, Y.-W.; Sun, G.; Chiang, I.-D.; Liao, C. Y.; Hsu, W.-L.; Lin, H. T.; Sun, S.; et al. *Nano Lett.* 2014, 14 (1), 225-230.
[11] Zheng, G.; MUhlenbernd, H.; Kenney, M.; Li, G.; Zentgraf, T.; Zhang, S. Nat. *Nanotechnol.* 2015, 10 (4), 308-312.
[12] Huang, Y.-W.; Chen, W. T.; Tsai, W.-Y.; Wu, P. C.; Wang, C.-M.; Sun, G.; Tsai, D. P. *Nano Lett.* 2015, 15 (5), 3122-3127.
[13] Lewi, T.; Evans, H. A.; Butakov, N. A.; Schuller, J. A. *Nano Lett.* 2017, 17 (6), 3940-3945.
[14] Rahmani, M.; Xu, L.; Miroshnichenko, A. E.; Komar, A.; Camacho-Morales, R.; Chen, H.; Zárate, Y.; Kruk, S.; Zhang, G.; Neshev, D. N.; et al. *Adv. Funct. Mater.* 2017, 27 (31), 1700580.
[15] Horie, Y.; Arbabi, A.; Arbabi, E.; Kamali, S. M.; Faraon, A. *ACS Photonics* 2018, 5 (5), 1711-1717.
[16] Yi, F.; Shim, E.; Zhu, A. Y.; Zhu, H.; Reed, J. C.; Cubukcu, E. *Appl. Phys. Lett.* 2013, 102 (22), 221102.
[17] Park, J.; Kang, J.-H.; Liu, X.; Brongersma, M. L. *Sci. Rep.* 2015, 5, 15754.
[18] Park, J.; Kang, J.-H.; Kim, S. J.; Liu, X.; Brongersma, M. L. *Nano Lett.* 2017, 17 (1), 407-413.
[19] Huang, Y.-W.; Lee, H. W. H.; Sokhoyan, R.; Pala, R. A.; Thyagarajan, K.; Han, S.; Tsai, D. P.; Atwater, H. A. *Nano Lett.* 2016, 16 (9), 5319-5325.
[20] Kafaie Shirmanesh, G.; Sokhoyan, R.; Pala, R. A.; Atwater, H. A. *Nano Lett.* 2018, 18 (5), 2957-2963.
[21] Jun, Y. C.; Reno, J.; Ribaudo, T.; Shaner, E.; Greffet, J.-J.; Vassant, S.; Marquier, F.; Sinclair, M.; Brener, I. *Nano Lett.* 2013, 13 (11), 5391-5396.
[22] Olivieri, A.; Chen, C.; Hassan, S.; Lisicka-Skrzek, E.; Tait, R. N.; Berini, P. *Nano Lett.* 2015, 15 (4), 2304-2311.
[23] Yao, Y.; Kats, M. A.; Genevet, P.; Yu, N.; Song, Y.; Kong, J.; Capasso, F. *Nano Lett.* 2013, 13 (3), 1257-1264.
[24] Jang, M. S.; Brar, V. W.; Sherrott, M. C.; Lopez, J. J.; Kim, L.; Kim, S.; Choi, M.; Atwater, H. A. *Phys. Rev. B: Condens. Matter Mater. Phys.* 2014, 90 (16), 165409.
[25] Dabidian, N.; Kholmanov, I.; Khanikaev, A. B.; Tatar, K.; Trendafilov, S.; Mousavi, S. H.; Magnuson, C.; Ruoff, R. S.; Shvets, G. *ACS Photonics* 2015, 2 (2), 216-227.
[26] Wu, P. C.; Papasimakis, N.; Tsai, D. P. *Phys. Rev. Appl.* 2016, 6 (4), 044019.
[27] Sherrott, M. C.; Hon, P. W. C.; Fountaine, K. T.; Garcia, J. C.; Ponti, S. M.; Brar, V. W.; Sweatlock, L. A.; Atwater, H. A. *Nano Lett.* 2017, 17 (5), 3027-3034.
[28] Kim, S.; Jang, M. S.; Brar, V. W.; Mauser, K. W.; Kim, L.; Atwater, H. A. *Nano Lett.* 2018, 18 (2), 971-979.
[29] Chen, Y.; Li, X.; Sonnefraud, Y.; Fernandez-Dominguez, A. I.; Luo, X.; Hong, M.; Maier, S. A. *Sci. Rep.* 2015, 5, 8660.
[30] Tittl, A.; Michel, A.-K. U.; Schaferling, M.; Yin, X.; Gholipour, B.; Cui, L.; Wuttig, M.; Taubner, T.; Neubrech, F.; Giessen, H. *Adv. Mater.* 2015, 27 (31), 4597-4603.
[31] Yin, X.; Steinle, T.; Huang, L.; Taubner, T.; Wuttig, M.; Zentgraf, T.; Giessen, H. *Light: Sci. Appl.* 2017, 6 (7), No. e17016.
[32] Wang, Q.; Rogers, E. T. F.; Gholipour, B.; Wang, C.-M.; Yuan, G.; Teng, J.; Zheludev, N. I. *Nat. Photonics* 2016, 10 (1), 60-65.
[33] de Galarreta, C. R.; Alexeev, A. M.; Au, Y.-Y.; Lopez-Garcia, M.; Klemm, M.; Cryan, M.; Bertolotti, J.; Wright, C. D. *Adv. Funct. Mater.* 2018, 28 (10), 1704993.
[34] Hosseini, P.; Wright, C. D.; Bhaskaran, H. *Nature* 2014, 511 (7508), 206-211.
[35] Driscoll, T.; Palit, S.; Qazilbash, M. M.; Brehm, M.; Keilmann, F.; Chae, B.-G.; Yun, S.-J.; Kim, H.-T.; Cho, S. Y.; Jokerst, N. M.; et al. *Appl. Phys. Lett.* 2008, 93 (2), 024101.
[36] Dicken, M. J.; Aydin, K.; Pryce, I. M.; Sweatlock, L. A.; Boyd, E. M.; Walavalkar, S.; Ma, J.; Atwater, H. A. *Opt. Express* 2009, 17 (20), 18330-18339.
[37] Kats, M. A.; Sharma, D.; Lin, J.; Genevet, P.; Blanchard, R.; Yang, Z.; Qazilbash, M. M.; Basov, D. N.; Ramanathan, S.; Capasso, F. *Appl. Phys. Lett.* 2012, 101 (22), 221101.
[38] Kocer, H.; Butun, S.; Banar, B.; Wang, K.; Tongay, S.; Wu, J.; Aydin, K. *Appl. Phys. Lett.* 2015, 106 (16), 161104.
[39] Dong, K.; Hong, S.; Deng, Y.; Ma, H.; Li, J.; Wang, X.; Yeo, J.; Wang, L.; Lou, S.; Tom, K. B.; et al. *Adv. Mater.* 2018, 30 (5), 1703878.
[40] Liu, M.; Hwang, H. Y.; Tao, H.; Strikwerda, A. C.; Fan, K.; Keiser, G. R.; Sternbach, A. J.; West, K. G.; Kittiwatanakul, S.; Lu, J.; et al. *Nature* 2012, 487 (7407), 345-348.
[41] Driscoll, T.; Kim, H.-T.; Chae, B.-G.; Kim, B.-J.; Lee, Y.-W.; Jokerst, N. M.; Palit, S.; Smith, D. R.; Ventra, M. D.; Basov, D. N. *Science* 2009, 325 (5947), 1518-1521.
[42] Liu, L.; Kang, L.; Mayer, T. S.; Werner, D. H. *Nat. Commun.* 2016, 7, 13236.
[43] Zhu, Z.; Evans, P. G.; Haglund, R. F.; Valentine, J. G. *Nano Lett.* 2017, 17 (8), 4881-4885.
[44] Hashemi, M. R. M.; Yang, S.-H.; Wang, T.; Sepulveda, N.; Jarrahi, M. *Sci. Rep.* 2016, 6, 35439.
[45] Decker, M.; Kremers, C.; Minovich, A.; Staude, I.; Miroshnichenko, A. E.; Chigrin, D.; Neshev, D. N.; Jagadish, C.; Kivshar, Y. S. *Opt. Express* 2013, 21 (7), 8879-8885.
[46] Sautter, J.; Staude, I.; Decker, M.; Rusak, E.; Neshev, D. N.; Brener, I.; Kivshar, Y. S. *ACS Nano* 2015, 9 (4), 4308-4315.
[47] Komar, A.; Paniagua-Dominguez, R.; Miroshnichenko, A.; Yu, Y. F.; Kivshar, Y. S.; Kuznetsov, A. I.; Neshev, D. *ACS Photonics* 2018, 5 (5), 1742-1748.

[48] Bohn, J.; Bucher, T.; Chong, K. E.; Komar, A.; Choi, D.-Y.; Neshev, D. N.; Kivshar, Y. S.; Pertsch, T.; Staude, I. *Nano Lett.* 2018, 18 (6), 3461-3465.

[49] Thyagarajan, K.; Sokhoyan, R.; Zornberg, L.; Atwater, H. A. *Adv. Mater.* 2017, 29 (31), 1701044.

[50] Ou, J.-Y.; Plum, E.; Zhang, J.; Zheludev, N. I. *Nat. Nanotechnol.* 2013, 8 (4), 252-255.

[51] Valente, J.; Ou, J.-Y.; Plum, E.; Youngs, I. J.; Zheludev, N. I. *Nat. Commun.* 2015, 6, 7021.

[52] Ee, H.-S.; Agarwal, R. *Nano Lett.* 2016, 16 (4), 2818-2823.

[53] Imada, M.; Fujimori, A.; Tokura, Y. *Rev. Mod. Phys.* 1998, 70 (4), 1039-1263.

[54] Qazilbash, M. M.; Brehm, M.; Chae, B.-G.; Ho, P.-C.; Andreev, G. O.; Kim, B.-J.; Yun, S. J.; Balatsky, A. V.; Maple, M. B.; Keilmann, F.; et al. *Science* 2007, 318 (5857), 1750-1753.

[55] Suh, J. Y.; Lopez, R.; Feldman, L. C.; Haglund, R. F. *J. Appl. Phys.* 2004, 96 (2), 1209-1213.

[56] Marvel, R. E.; Harl, R. R.; Craciun, V.; Rogers, B. R.; Haglund, R. F. *Acta Mater.* 2015, 91, 217-226.

[57] Rozen, J.; Lopez, R.; Haglund, R. F.; Feldman, L. C. *Appl. Phys. Lett.* 2006, 88 (8), 081902.

[58] Sharoni, A.; Ramirez, J. G.; Schuller, I. K. *Phys. Rev. Lett.* 2008, 101 (2), 026404.

[59] Choi, H. S.; Ahn, J. S.; Jung, J. H.; Noh, T. W.; Kim, D. H. *Phys. Rev. B: Condens. Matter Mater. Phys.* 1996, 54 (7), 4621-4628.

[60] Carr, G. L.; Perkowitz, S.; Tanner, D. B. Far-Infrared Properties of Inhomogeneous Materials. In *Infrared and Millimeter Waves*; Academic Press, 1985; Vol. 13, pp 171-263.

[61] Homes, C. C.; Xu, Z. J.; Wen, J. S.; Gu, G. D. *Phys. Rev. B: Condens. Matter Mater. Phys.* 2012, 86 (14), 144530.

[62] Markov, P.; Marvel, R. E.; Conley, H. J.; Miller, K. J.; Haglund, R. F.; Weiss, S. M. *ACS Photonics* 2015, 2 (8), 1175-1182.

The invention claimed is:

1. An electrically tunable metasurface, comprising:
an array of subwavelength metasurface unit elements, each unit element comprising:
a bottom conductive layer;
an insulating layer overlying the bottom conductive layer;
an active layer overlying the insulator layer; and
a top conductive layer overlying the active layer,
wherein
the active layer comprises a phase change material having a phase controllable via
resistive heating produced by a flow of a control current through the top conductive layer of the unit elements,
the active layer and the top conductive layer of the unit elements are formed according to a periodic pattern of the array,
the periodic pattern comprises a shape of a strip with a length between respective ends of the strip that extends over an entire length of the array,
the flow of the control current is provided via coupling of an electrical bias supply to contact pads coupled to the top conductive layer at the respective ends of the strip, and
the phase change material is germanium antimony telluride (GST).

2. An electrically tunable metasurface, comprising:
an array of subwavelength metasurface unit elements, each unit element comprising:
a bottom conductive layer;
an insulating layer overlying the bottom conductive layer;
an active layer overlying the insulator layer; and
a top conductive layer overlying the active layer,
wherein
the active layer comprises a phase change material having a phase controllable via
resistive heating produced by a flow of a control current through the top conductive layer of the unit elements,
the active layer and the top conductive layer of the unit elements are formed according to a periodic pattern of the array,
the periodic pattern comprises a shape of a strip with a length between respective ends of the strip that extends over an entire length of the array,
the flow of the control current is provided via coupling of an electrical bias supply to contact pads coupled to the top conductive layer at the respective ends of the strip,
the phase change material is vanadium dioxide ($VO_2$),
each of the bottom conductive layer and the top conductive layer comprises at least one of: a) a metal; b) a semiconductor; c) a transparent conducting oxide; and d) a transition metal nitride, and
the semiconductor comprises one or a combination of: b1) gallium arsenide (GaAs), and b2) silicon.

3. An electrically tunable metasurface, comprising:
an array of subwavelength metasurface unit elements, each unit element comprising:
a bottom conductive layer;
an insulating layer overlying the bottom conductive layer;
an active layer overlying the insulator layer; and
a top conductive layer overlying the active layer,
wherein
the active layer comprises a phase change material having a phase controllable via
resistive heating produced by a flow of a control current through the top conductive layer of the unit elements,
the active layer and the top conductive layer of the unit elements are formed according to a periodic pattern of the array,
the periodic pattern comprises a shape of a strip with a length between respective ends of the strip that extends over an entire length of the array,
the flow of the control current is provided via coupling of an electrical bias supply to contact pads coupled to the top conductive layer at the respective ends of the strip,
the phase change material is vanadium dioxide ($VO_2$),
each of the bottom conductive layer and the top conductive layer comprises at least one of: a) a metal; b) a semiconductor; c) a transparent conducting oxide; and d) a transition metal nitride, and
the transparent conducting oxide comprises one or a combination of: c1) indium tin oxide (ITO), c2) aluminum-doped zinc oxide (AZO), and c3) aluminum-doped zinc oxide (GZO).

4. An electrically tunable metasurface, comprising:
an array of subwavelength metasurface unit elements, each unit element comprising:
a bottom conductive layer;
an insulating layer overlying the bottom conductive layer;

an active layer overlying the insulator layer; and
a top conductive layer overlying the active layer,
wherein
the active layer comprises a phase change material having a phase controllable via
resistive heating produced by a flow of a control current through the top conductive layer of the unit elements,
the active layer and the top conductive layer of the unit elements are formed according to a periodic pattern of the array,
the periodic pattern comprises a shape of a strip with a length between respective ends of the strip that extends over an entire length of the array,
the flow of the control current is provided via coupling of an electrical bias supply to contact pads coupled to the top conductive layer at the respective ends of the strip,
the phase change material is vanadium dioxide ($VO_2$),
each of the bottom conductive layer and the top conductive layer comprises at least one of: a) a metal; b) a semiconductor; c) a transparent conducting oxide; and d) a transition metal nitride, and
the transition metal nitride comprises one or a combination of: d1) titanium nitride (TiN), and d2) zirconium nitride (ZrN).

5. An electrically tunable metasurface, comprising:
an array of subwavelength metasurface unit elements, each unit element comprising:
a bottom conductive layer;
an insulating layer overlying the bottom conductive layer;
an active layer overlying the insulator layer; and
a top conductive layer overlying the active layer,
wherein
the active layer comprises a phase change material having a phase controllable via
resistive heating produced by a flow of a control current through the top conductive layer of the unit elements,
the active layer and the top conductive layer of the unit elements are formed according to a periodic pattern of the array,
the periodic pattern comprises a shape of a strip with a length between respective ends of the strip that extends over an entire length of the array,
the flow of the control current is provided via coupling of an electrical bias supply to contact pads coupled to the top conductive layer at the respective ends of the strip,
the phase change material is vanadium dioxide ($VO_2$),
the active layer is grown onto the insulating layer via a deposition process, and
the bottom conductive layer is gold (Au), the insulating layer is silicon dioxide ($SiO_2$), and the top conductive layer is gold (Au).

6. An electrically tunable metasurface, comprising:
an array of subwavelength metasurface unit elements, each unit element comprising:
a bottom conductive layer;
an insulating layer overlying the bottom conductive layer;
an active layer overlying the insulator layer; and
a top conductive layer overlying the active layer,
wherein
the active layer comprises a phase change material having a phase controllable via
resistive heating produced by a flow of a control current through the top conductive layer of the unit elements,
the active layer and the top conductive layer of the unit elements are formed according to a periodic pattern of the array,
the periodic pattern comprises a shape of a strip with a length between respective ends of the strip that extends over an entire length of the array, a
the flow of the control current is provided via coupling of an electrical bias supply to contact pads coupled to the top conductive layer at the respective ends of the strip.

7. The electrically tunable metasurface of claim 6, wherein:
the array has a substantially square shape with a total area of about 100 μm×100 μm.

8. A wavefront manipulation system, comprising:
the electrically tunable metasurface of claim 6,
wherein the wavefront manipulation system is configured to implement functionality of one of: a) beam steering, b) focusing lens, c) polarization control, d) holographic imaging, e) absorber, and f) color filtering.

9. The electrically tunable metasurface of claim 6, wherein:
a period of the periodic pattern is 400 nm,
a width of each the active layer and the top conductive layer is 210 nm,
a thickness of the bottom conductive layer is 150 nm,
a thickness of the insulating layer is 50 nm,
a thickness of the active layer is 40 nm, and
a thickness of the top conductive layer is 40 nm.

* * * * *